United States Patent
Hirayama et al.

(10) Patent No.: US 7,901,865 B2
(45) Date of Patent: *Mar. 8, 2011

(54) RESIST COMPOSITION AND PROCESS FOR FORMATION OF RESIST PATTERNS

(75) Inventors: Taku Hirayama, Kawasaki (JP); Daiju Shiono, Kawasaki (JP); Hideo Hada, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 23 days.

This patent is subject to a terminal disclaimer.

(21) Appl. No.: 11/574,805

(22) PCT Filed: Sep. 2, 2005

(86) PCT No.: PCT/JP2005/016113
§ 371 (c)(1),
(2), (4) Date: Mar. 6, 2007

(87) PCT Pub. No.: WO2006/028014
PCT Pub. Date: Mar. 16, 2006

(65) Prior Publication Data
US 2008/0020288 A1    Jan. 24, 2008

(30) Foreign Application Priority Data
Sep. 8, 2004    (JP) .................. 2004-260764

(51) Int. Cl.
G03F 7/004 (2006.01)
G03F 7/028 (2006.01)
G03F 7/039 (2006.01)

(52) U.S. Cl. .......... 430/270.1; 430/326; 430/913

(58) Field of Classification Search ............... 430/270.1, 430/326, 913, 922, 925
See application file for complete search history.

(56) References Cited

U.S. PATENT DOCUMENTS

| | | | |
|---|---|---|---|
| 5,658,706 A | 8/1997 | Niki et al. | |
| 5,693,452 A | 12/1997 | Aoai et al. | |
| 5,707,776 A | 1/1998 | Kawabe et al. | |
| 5,824,451 A * | 10/1998 | Aoai et al. | 430/270.1 |
| 5,837,420 A * | 11/1998 | Aoai et al. | 430/270.1 |
| 5,844,057 A | 12/1998 | Watanabe et al. | |
| 5,994,025 A * | 11/1999 | Iwasa et al. | 430/270.1 |
| 6,037,098 A | 3/2000 | Aoai et al. | |
| 6,106,993 A | 8/2000 | Watanabe et al. | |
| 6,165,677 A * | 12/2000 | Yako | 430/270.1 |
| 6,197,473 B1 | 3/2001 | Kihara et al. | |
| 6,638,683 B1 | 10/2003 | Tan et al. | |
| 7,220,808 B2 | 5/2007 | Yamagishi et al. | |
| 7,504,196 B2 | 3/2009 | Shiono et al. | |
| 2002/0025495 A1 | 2/2002 | Ogata et al. | |
| 2002/0058205 A1 | 5/2002 | Nakashima et al. | |
| 2003/0232277 A1 | 12/2003 | Sasaki et al. | |
| 2004/0005512 A1 | 1/2004 | Mizutani et al. | |
| 2004/0234885 A1 | 11/2004 | Watanabe et al. | |
| 2005/0271971 A1 | 12/2005 | Ueda et al. | |
| 2007/0259273 A1 * | 11/2007 | Shiono et al. | 430/4 |
| 2007/0281243 A1 * | 12/2007 | Hirayama | 430/270.1 |
| 2008/0020288 A1 | 1/2008 | Hirayama et al. | |
| 2008/0145784 A1 * | 6/2008 | Shiono et al. | 430/281.1 |
| 2009/0162781 A1 | 6/2009 | Shiono et al. | |

FOREIGN PATENT DOCUMENTS

| | | |
|---|---|---|
| JP | 05-061197 | 3/1993 |
| JP | H05-249681 | 9/1993 |
| JP | H06-059444 | 3/1994 |
| JP | 06-167811 | 6/1994 |
| JP | 6-266109 A | 9/1994 |
| JP | 08-193054 | 7/1996 |
| JP | H08-220740 | 8/1996 |
| JP | H08-262712 | 10/1996 |
| JP | H08-337616 | 12/1996 |
| JP | 09-005999 | 1/1997 |
| JP | H09-160246 | 6/1997 |
| JP | H09-211866 | 8/1997 |
| JP | H10-123703 A | 5/1998 |
| JP | A 10-274845 | 10/1998 |
| JP | A-11-153863 | 6/1999 |
| JP | H11-153868 | 6/1999 |

(Continued)

OTHER PUBLICATIONS

Hirayama, T., Shiono, D, Matsumaru, S., Ogata, T., Hada, H., Onodera, J., Arai, T., Sakamizu, T., Yamaguchi, A., Shiraishi, H., Fukuda, H., Ueda, M- "Depth Profile and Line-Edge Roughness of Low-Molecular-Weight Amorpjous Electron Beam Resists", The Japan Journal of Applied Physics, vol. 44, No. 7B, 2005, pp. 5484-5488 (published on Jul. 26, 2005).*

Office Action issued in Korean Patent Application No. 10-2007-7004390, dated Dec. 17, 2008.

Office Action issued in Korean Patent Application No. 10-2008-7025851, dated Jan. 7, 2009.

Decision to Grant a Patent issued on Jan. 6, 2009 in Japanese Patent Application No. 2004-182301.

Office Action issued in counterpart Japanese Patent Application No. JP 2004-260764, dated Mar. 3, 2009.

Office Action issued in counterpart Japanese Patent Application No. JP 2005-050721, dated Mar. 3, 2009.

(Continued)

Primary Examiner — Cynthia H Kelly
Assistant Examiner — Anca Eoff
(74) Attorney, Agent, or Firm — Knobbe, Martens, Olson & Bear, LLP

(57) ABSTRACT

A resist composition that includes a base material component (A), which contains acid-dissociable, dissolution-inhibiting groups and exhibits increased alkali solubility under the action of acid, an acid generator component (B) that generates acid on exposure, and an organic solvent (C), in which the components (A) and (B) are dissolved in the organic solvent (C), wherein the base material component (A) contains a protected form (A1) of a polyhydric phenol compound (a) having two or more phenolic hydroxyl groups and a molecular weight within a range from 300 to 2,500, in which either a portion of, or all of, the phenolic hydroxyl groups are protected with acid-dissociable, dissolution-inhibiting groups, and the organic solvent (C) comprises an alcohol.

15 Claims, No Drawings

FOREIGN PATENT DOCUMENTS

| | | |
|---|---|---|
| JP | H11-167199 | 6/1999 |
| JP | H11-199533 | 7/1999 |
| JP | 2000-086584 | 3/2000 |
| JP | 2000-305270 | 11/2000 |
| JP | 2000-330282 | 11/2000 |
| JP | 2001-312055 | 11/2001 |
| JP | 2002-99088 A | 4/2002 |
| JP | 2002-099089 | 4/2002 |
| JP | 2002-221787 A | 8/2002 |
| JP | 2002-328473 | 11/2002 |
| JP | A-2002-328473 | 11/2002 |
| JP | 2003-084437 | 3/2003 |
| JP | A-2003-084437 | 3/2003 |
| JP | 2003-183227 | 7/2003 |
| JP | 2003-260881 | 9/2003 |
| JP | 2004-062049 | 2/2004 |
| JP | 2004-125835 | 4/2004 |
| JP | 2004-151605 | 5/2004 |
| JP | 2004-191913 | 7/2004 |
| JP | A-2004-191913 | 7/2004 |
| JP | 2004-302440 | 10/2004 |
| JP | 2004-359590 | 12/2004 |
| JP | 2002-055452 | 2/2005 |
| JP | 2005-089387 | 4/2005 |
| JP | 2005-091909 | 4/2005 |
| JP | 2005-309421 | 11/2005 |
| KR | 0231242 | 5/1997 |
| KR | 2001-0088341 | 9/2001 |
| KR | 10-0406242 | 11/2003 |
| TW | 200302397 A | 8/2003 |
| TW | 200617602 | 6/2006 |
| WO | WO 2006/046383 | 5/2006 |

OTHER PUBLICATIONS

Office Action issued in counterpart Japanese Patent Application No. JP 2005-050721, dated Jul. 28, 2009.
Office Action issued on Apr. 14, 2008 on the counterpart Korean Patent Application No. 10-2007-7004390.
Office Action and Search Report issued on May 12, 2008, on the counterpart Taiwanese Patent Application No. 094104523.
Yamaguchi et al., *Linewidth fluctuations caused by polymer aggregates in resist films*, Journal of Photopolymer Science and Technology, vol. 10, No. 4, pp. 635-640, (1997).
Notice of Allowance issued on related Korean Patent Application No. 10-2009-7006750, dated Feb. 16, 2010.
Hirayama, T., et al. "Depth Profile and Line-Edge Roughness of Low-Molecular-Weight Amorphous Electron Beam Resists", The Japan Journal of Applied Physics, vol. 44, No. 7B, 2005, pp. 5484-5488 (published on Jul. 26, 2005).
Hirayama et al, "Development of Amorphous PolyPhenol Resists with Low Molecular Weight and Narrow Dispersion for EB Lithography", IEEE Xplore, Oct. 22, 2004, pp. 10-11.
Hirayama et al. "Development of Electron Beam Resists Based on Amorphous Polyphenols with Low Molecular Weight and Narrow Dispersion" Proceedings of SPIE vol. 5753, p. 738-745 (2005).
Hirayama et al., Journal of Photopolymer Science and Technology, vol. 17, No. 3, 435-440, (2004).
Notice of Allowance issued on corresponding Japanese Patent Application No. 2004-260764, dated Feb. 16, 2010.
Office Action issued in corresponding U.S. Appl. No. 10/590,046, dated Mar. 17, 2010.
Office Action issued in corresponding U.S. Appl. No. 10/590,046, dated Sep. 21, 2009.
Office Action issued in corresponding U.S. Appl. No. 10/590,046, dated Apr. 24, 2009.
Office Action issued in corresponding U.S. Appl. No. 10/590,046, dated Sep. 26, 2008.
Office Action issued in corresponding U.S. Appl. No. 11/572,630, dated Mar. 1, 2010.
Office Action issued in corresponding U.S. Appl. No. 11/572,630, dated Aug. 13, 2009.
Office Action issued in corresponding U.S. Appl. No. 11/572,630, dated Apr. 23, 2009.
Office Action issued in corresponding U.S. Appl. No. 11/572,630, dated Sep. 25, 2008.
Office Action issued in corresponding U.S. Appl. No. 11/718,091 dated Apr. 23, 2010.
Office Action issued in corresponding U.S. Appl. No. 11/718,091 dated Sep. 14, 2009.
Office Action issued in corresponding U.S. Appl. No. 11/813,511, dated Apr. 28, 2010.
Office Action issued in corresponding U.S. Appl. No. 11/813,511, dated Oct. 8, 2009.
Office Action issued in corresponding U.S. Appl. No. 11/884,748, dated Jul. 7, 2008.
Office Action issued in corresponding U.S. Appl. No. 11/914,451 dated May 3, 2010.
Office Action issued in corresponding U.S. Appl. No. 11/914,451 dated Oct. 8, 2009.
Office Action issued in corresponding U.S. Appl. No. 11/917,458, dated Apr. 5, 2010.
Office Action issued in corresponding U.S. Appl. No. 11/994,602, dated Mar. 8, 2010.
International Search Report from PCT/JP2006/302271, mailed on Mar. 7, 2006.
International Search Report in connection with corresponding PCT application No. PCT/JP2006/313103, dated Sep. 26, 2006.
International Search Report issued in corresponding PCT Application No. PCT/JP2006/311443, dated Jun. 7, 2006.
International Search Report, PCT/JP2006/301679, Feb. 16, 2006.
International Search Report dated Sep. 6, 2005 for PCT/JP2005/013564, filed Jul. 28, 2004.
International Search Report issued in corresponding PCT application No. PCT/JP2005/018143, mailed Nov. 15, 2005.
Office Action issued on counterpart Japanese Patent Application No. 2004-182300, dated May 27, 2008.
Office Action issued on the counterpart Japanese Patent Application No. 2004-182301, dated Aug. 26, 2008.
Office Action issued on the counterpart Japanese Patent Application No. 2004-182301, dated Jun. 3, 2008.
Office Action issued on the counterpart Korean Patent Application No. 10-2007-7019433, dated Jun. 5, 2008.
Office Action issued Sep. 16, 2008 in the counterpart Korean Patent Application No. 10-2007-7010473.
Office Action issued in counterpart Japanese Patent Application No. 2005-026266, dated Mar. 3, 2009.
Office Action issued in counterpart Korean Patent Application No. 10-2007-7017441, dated May 7, 2009.
Office Action issued in related U.S. Appl. No. 11/572,630, dated Jul. 12, 2010.
Office Action issued in related U.S. Appl. No. 10/590,046, dated Jul. 20, 2010.
Search Report issued in related European Patent Application No. EP 05788289.6, dated Jul. 26, 2010.
Notice of Allowance issued in related U.S. Appl. No. 11/718,091 dated Aug. 10, 2010.
Office Action issued in related U.S. Appl. No. 11/994,602, dated Aug. 19, 2010.
Notice of Allowance issued in related U.S. Appl. No. 11/917,458, dated Sep. 7, 2010.
European Search Report issued in related European Patent Application No. EP 06732357.6, dated Aug. 30, 2010.
Final Office Action issued in related U.S. Appl. No. 11/813,511, dated Oct. 6, 2010.

* cited by examiner

RESIST COMPOSITION AND PROCESS FOR FORMATION OF RESIST PATTERNS

RELATED APPLICATIONS

This application is the U.S. National Phase filing under 35 U.S.C. §371 of PCT/JP2005/016113, filed Sep. 2, 2005, which designated the United States and was published in a language other than English, which claims priority under 35 U.S.C. §119(a)-(d) to Japanese Patent Application No. 2004-260764, filed Sep. 8, 2004. The content of these applications is incorporated herein by reference in their entireties.

TECHNICAL FIELD

The present invention relates to a resist composition and a process for the formation of resist patterns.

BACKGROUND ART

In recent years, in the production of semiconductor elements and liquid crystal display elements, advances in lithography techniques have lead to rapid progress in the field of patterns miniaturization. Typically, these miniaturization techniques involve shortening the wavelength of the exposure light source. Conventionally, ultraviolet radiation typified by g-line and i-line radiation has been used, but nowadays mass production of semiconductor elements using KrF excimer lasers and ArF excimer lasers has commenced. Furthermore, investigation is also being conducted into the use of radiation with even shorter wavelengths than these excimer lasers, such as $F_2$ excimer lasers, electron beams, EUV (extreme ultraviolet radiation), and X-rays.

Furthermore, one example of a known pattern-forming material capable of forming a pattern of minute dimensions is a chemically amplified resist, which includes a base material component with a film-forming capability, and an acid generator component that generates an acid upon exposure. Chemically amplified resists include negative type, which undergo a reduction in alkali solubility on exposure, and positive type, which display increased alkali solubility on exposure. These resist materials are typically dissolved in an organic solvent prior to use.

Polymers with a weight average molecular weight of approximately 5,000 or greater have conventionally been used as the base material component for these types of chemically amplified resists, and examples of these polymers include polyhydroxystyrene (PHS), PHS-based resins in which a portion of the hydroxyl groups have been protected with acid-dissociable, dissolution-inhibiting groups, and copolymers derived from acrylate esters and/or methacrylate esters, all of which exhibit a high degree of transparency relative to a KrF excimer laser (248 nm) or the like. Furthermore, onium salt-based acid generators are the most widely used acid generators. As the organic solvent, solvents such as propylene glycol monomethyl ether acetate (hereafter abbreviated as PGMEA) and ethyl lactate (hereafter abbreviated as EL) are typically used, either alone, or as part of a mixed solvent.

However, when a pattern is formed using these types of materials, a problem arises in that roughness can develop on the upper surfaces and side wall surfaces of the pattern.

This type of roughness has conventionally posed few problems. However in recent years, with the rapid miniaturization of semiconductor elements and the like, ever higher levels of resolution such as width dimensions of no more than 90 nm are being demanded, and this miniaturization has meant that roughness is becoming a more serious problem. For example, when a line pattern is formed, roughness on the side wall surfaces of the pattern known as LER (line edge roughness) causes fluctuation in the line width that is formed. The controlled degree of this fluctuation in the line width is required to be suppressed to no more than approximately 10% of the width dimension, and the effects of LER increase as the pattern dimensions are reduced. For example, when a line pattern with dimensions of approximately 90 nm is formed, the controlled degree of the fluctuation in the line width is preferably suppressed to no more than approximately 10 nm.

However, the polymers typically used as base materials have a large root mean square radius per molecule of several nm, and therefore the degree of fluctuation described above is equivalent to the width of only a few polymer molecules. As a result, as long as such polymers are used as the base material component, reductions in LER will remain extremely difficult to achieve.

On the other hand, the use of low molecular weight materials containing alkali-soluble groups such as hydroxyl groups, wherein either a portion of, or all of, those groups are protected with acid-dissociable, dissolution-inhibiting groups, as the base material has also been proposed (for example, see patent documents 1 and 2). These low molecular weight materials have small root mean square radius values as a result of their lower molecular weight, and as such, their contribution to increase of LER is expected to be small.

However, even when these low molecular weight materials are used, achieving a satisfactory improvement in LER remains difficult, and further reductions in the level of LER are still keenly sought.

[Patent Document 1]
Japanese Unexamined Patent Application, First Publication No. 2002-099088
[Patent Document 2]
Japanese Unexamined Patent Application, First Publication No. 2002-099089

DISCLOSURE OF INVENTION

Problems to be Solved by the Invention

The present invention addresses the circumstances described above, with an object of providing a resist composition and a process for forming a resist pattern that are capable of forming a high resolution pattern with a reduced level of LER.

Means for Solving the Problems

As a result of intensive investigation, the inventors of the present invention discovered that the above object could be achieved by combining a protected form of a polyhydric phenol compound with a specific low molecular weight, in which the phenolic hydroxyl groups are protected with acid-dissociable, dissolution-inhibiting groups, and an alcohol, and they were therefore able to complete the present invention.

In other words, a first aspect of the present invention is a resist composition that includes a base material component (A), which contains acid-dissociable, dissolution-inhibiting groups and exhibits increased alkali solubility under the action of acid, an acid generator component (B) that generates acid on exposure, and an organic solvent (C), in which the components (A) and (B) are dissolved in the organic solvent (C), wherein the base material component (A) contains a protected form (A1) of a polyhydric phenol compound (a) having two or more phenolic hydroxyl groups and a molecular weight within a range from 300 to 2,500, in which either a portion of; or all of, the phenolic hydroxyl groups are protected with acid-dissociable, dissolution-inhibiting groups, and the organic solvent (C) includes an alcohol.

Furthermore, a second aspect of the present invention is a process for forming a resist pattern that includes forming a resist film on a substrate using the resist composition according to the first aspect, exposing the resist film, and developing the resist film to form the resist pattern.

In the present invention, the term "exposure" is used as a general concept that can include irradiation with any form of radiation.

Effects of the Invention

According to the present invention, there are provided a resist composition and a process for forming a resist pattern that enable the formation of a high resolution pattern with a reduced level of LER.

BEST MODE FOR CARRYING OUT THE INVENTION (Resist Composition)

A resist composition of the present invention includes a base material component (A) (hereafter also referred to as the component (A)), which contains acid-dissociable, dissolution-inhibiting groups and exhibits increased alkali solubility under the action of acid, and an acid generator component (B) (hereafter also referred to as the component (B)) that generates acid on exposure, which are dissolved in an organic solvent (C) (hereafter also referred to as the component (C)).

In the component (A), the action of the acid generated from the component (B) upon exposure causes the acid-dissociable, dissolution-inhibiting groups to dissociate, causing the entire component (A) to change from an alkali-insoluble state to an alkali-soluble state. As a result, during the formation of a resist pattern, when a resist film formed from the resist composition is either selectively exposed, or selectively exposed and then subjected to post exposure baking, the exposed portions of the resist shift to an alkali-soluble state, whereas the unexposed portions remain insoluble in alkali. In this way, a positive resist pattern can be formed by alkali developing.

(Component (A))

In the present invention, the component (A) contains a protected form (A1) of a polyhydric phenol compound (a) having two or more phenolic hydroxyl groups and a molecular weight within a range from 300 to 2,500, in which either a portion of, or all of, the phenolic hydroxyl groups are protected with acid-dissociable, dissolution-inhibiting groups.

In this description, the polyhydric phenol compound (a) refers to the compound prior to protection with the acid-dissociable, dissolution-inhibiting groups, whereas the compound that has been protected with the acid-dissociable, dissolution-inhibiting groups is referred to as the protected form (A1). The component (A) comprises this protected form (A1).

There are no particular restrictions on the polyhydric phenol compound (a) which can be included in the formation of the protected form (A1), provided the compound (a) is a polyhydric phenol compound having two or more phenolic hydroxyl groups and a molecular weight within a range from 300 to 2,500. Examples of suitable compounds thereof include the polyhydric phenol compounds known as sensitizers or heat resistance improvement agents for non-chemically amplified type g-line or i-line resists. Specific examples of these polyhydric phenols include the compounds listed below:

bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, bis(4-hydroxy-3,5-dimethylphenyl)-2-hydroxyphenylmethane, bis(4-hydroxy-3,5-dimethylphenyl)-4-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(4-hydroxy-3-methylphenyl)-2-hydroxyphenylmethane, bis(3-cyclohexyl-4-hydroxy-6-methylphenyl)-2-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(4-hydroxy-3,5-dimethylphenyl)-2-hydroxyphenylmethane, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, 1-[1-(4-hydroxyphenyl)isopropyl]-4-[1,1-bis(4-hydroxyphenyl)ethyl]benzene, and four-benzene ring compounds of formalin condensation products of phenols such as phenol, m-cresol, p-cresol and xylenol. The term "four-benzene ring compound" refers to a compound containing four benzene rings (or benzene nuclei).

In the present invention, the use of at least one compound selected from the group consisting of polyhydric phenol compounds represented by general formulas (I), (II) and (III) shown below provides particularly superior effects for the present invention, and is consequently preferred. The reason for this preference is the presence of hydroxyl group-containing benzene ring structures (which may also include substituent groups) shown below. It is thought that as a result of these structures, the compound not only exhibits an ability to form films with a high degree of amorphicity (non-crystallinity) and favorable stability, but also exhibits a high level of solubility in alcohols.

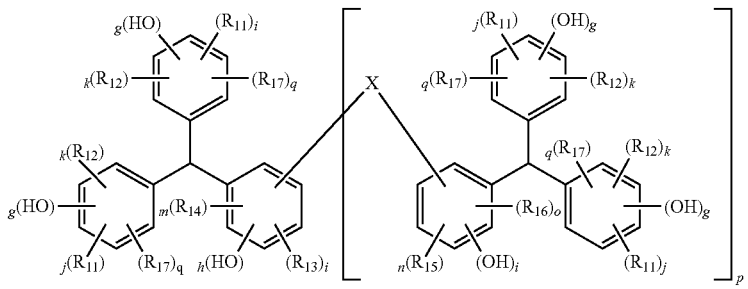

(I)

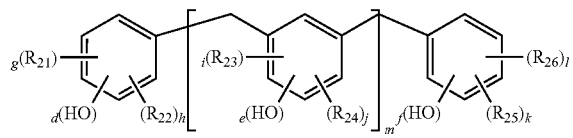

(II)

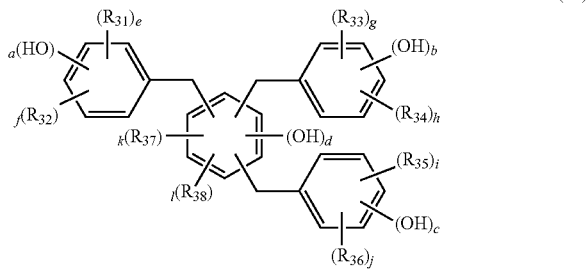

(III)

In the above general formula (I), $R_{11}$ through $R_{17}$ each represent, independently, a straight-chain, branched, or cyclic alkyl group of 1 to 10 carbon atoms, and preferably a lower alkyl group of 1 to 5 carbon atoms, or a cyclic alkyl group of 5 to 6 carbon atoms or aromatic hydrocarbon group. These alkyl groups or aromatic hydrocarbon groups may include a hetero atom such as an oxygen atom, nitrogen atom, and sulfur atom within the structure. Specific examples of suitable aromatic hydrocarbon groups include a phenyl group, tolyl group, xylyl group, mesityl group, phenethyl group, and naphthyl group.

g and j each represent, independently, an integer of 1 or greater, and preferably an integer from 1 to 2, k and q each represent, independently, either 0 or an integer of 1 or more, and preferably an integer that does not exceed 2, and g+j+k+q is no greater than 5.

h is an integer of 1 or greater, and preferably an integer from 1 to 2, l and m each represent, independently, either 0 or an integer of 1 or greater, and preferably an integer that does not exceed 2, and h+l+m is no greater than 4.

i is an integer of 1 or greater, and preferably an integer from 1 to 2, n and o each represent, independently, either 0 or an integer of 1 or greater, and preferably an integer that does not exceed 2, and i+n+o is no greater than 4.

p is either 0 or 1, and is preferably 1.

X is a group represented by a general formula (Ia) or (Ib) shown below.

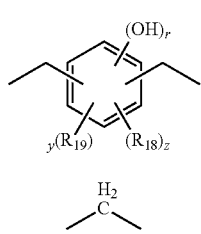

(Ia)

(Ib)

(In the formula (Ia), $R_{18}$ and $R_{19}$, in a similar manner to the aforementioned groups $R_{11}$ through $R_{17}$, each represent, independently, an alkyl group of 1 to 10 carbon atoms or aromatic hydrocarbon group that may include a hetero atom within the structure, r, y, and z each represent, independently, either 0 or an integer of 1 or greater, and r+y+z is no greater than 4.)

Of these possibilities, compounds in which $R_{11}$ is a cycloalkyl group, j is 1, $R_{12}$ is a lower alkyl group, k is 1, and g is 1 are preferred.

In addition, compounds in which $R_{11}$ is a cycloalkyl group, j is 1, $R_{12}$ is a lower alkyl group, k is 1, and g is 1, and moreover, q, l, m, n and o are zero, and h and i are both 1 enable the formation of a fine pattern with reduced LER and a high level of resolution, and are consequently particularly preferred.

Compounds in which X is a group represented by the above general formula (Ib) are the most preferred in terms of ease of synthesis.

Of the polyhydric phenol compounds represented by the above general formula (I), the most preferred compounds are the polyhydric phenol compound represented by a formula (I-1) shown below, and the polyhydric phenol compound represented by a formula (I-2) shown below.

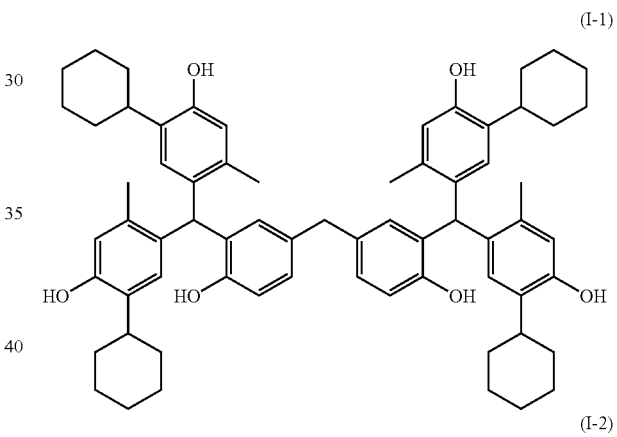

(I-1)

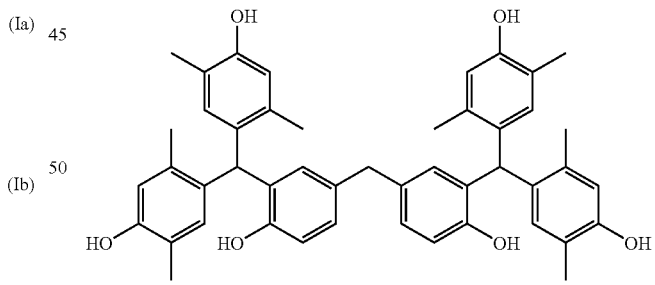

(I-2)

In the above general formula (II), $R_{21}$ through $R_{26}$ each represent, independently, a straight-chain, branched, or cyclic alkyl group of 1 to 10 carbon atoms, and preferably a lower alkyl group of 1 to 5 carbon atoms, or a cyclic alkyl group of 5 to 6 carbon atoms or aromatic hydrocarbon group. These alkyl groups or aromatic hydrocarbon groups may include a hetero atom such as an oxygen atom, nitrogen atom, and sulfur atom within the structure. Specific examples of suitable aromatic hydrocarbon groups include a phenyl group, tolyl group, xylyl group, mesityl group, phenethyl group, and naphthyl group. Of these possibilities, $R_{21}$ through $R_{26}$ are preferably all lower alkyl groups.

d and g each represent, independently, an integer of 1 or greater, and preferably an integer from 1 to 2, h represents either 0 or an integer of 1 or greater, and preferably an integer that does not exceed 2, and d+g+h is no greater than 5.

e represents an integer of 1 or greater, and preferably an integer from 1 to 2, i and j each represent, independently, either 0 or an integer of 1 or greater, and preferably an integer that does not exceed 2, and e+i+j is no greater than 4.

f and k each represent, independently, an integer of 1 or greater, and preferably an integer from 1 to 2, l represents either 0 or an integer of 1 or greater, and preferably an integer that does not exceed 2, and f+k+l is no greater than 5.

m is an integer from 1 to 20, and preferably from 2 to 10.

In the above general formula (III), $R_{31}$ through $R_{38}$ each represent, independent, a straight-chain, branched, or cyclic alkyl group of 1 to 10 carbon atoms, and preferably a lower alkyl group of 1 to 5 carbon atoms, or a cyclic alkyl group of 5 to 6 carbon atoms or aromatic hydrocarbon group. These alkyl groups or aromatic hydrocarbon groups may include a hetero atom such as an oxygen atom, nitrogen atom, and sulfur atom within the structure. Specific examples of suitable aromatic hydrocarbon groups include a phenyl group, tolyl group, xylyl group, mesityl group, phenethyl group, and naphthyl group. Of these possibilities, $R_{31}$ through $R_{38}$ are preferably all lower alkyl groups.

a and e each represent, independently, an integer of 1 or greater, and preferably an integer from 1 to 2, f represents either 0 or an integer of 1 or greater, and preferably an integer that does not exceed 2, and a+e+f is no greater than 5.

b and h each represent, independently, an integer of 1 or greater, and preferably an integer from 1 to 2, g represents either 0 or an integer of 1 or greater, and preferably an integer that does not exceed 2, and b+h+g is no greater than 5.

c and i each represent, independently, an integer of 1 or greater, and preferably an integer from 1 to 2, j represents either 0 or an integer of 1 or greater, and preferably an integer that does not exceed 2, and c+i+j is no greater than 5.

d represents an integer of 1 or greater, and preferably an integer from 1 to 2, k and l each represent, independently, either 0 or an integer of 1 or greater, and preferably an integer that does not exceed 2, and d+k+l is no greater than 3.

In the present invention, the polyhydric phenol compound (a) is required to have a molecular weight within a range from 300 to 2,500, and this molecular weight is preferably from 450 to 1,500, and even more preferably from 500 to 1,200. By ensuring that the molecular weight is no higher than the above upper limit, roughness is reduced, the pattern shape is further improved, and the resolution also improves. Furthermore, ensuring that the molecular weight is at least as large as the lower limit enables the formation of a resist pattern with a favorable profile shape.

Furthermore, if the dispersion degree of molecular weight (Mw/Mn) for the polyhydric phenol compound (a) is no higher than 1.5, then the effects of the present invention are further enhanced and it is consequently preferred. It is thought that the reason for this observation is that provided the polyhydric phenol compound (a) has a narrow molecular weight distribution in which the dispersity is no more than 1.5, then even if the polyhydric phenol material contains a plurality of protected forms (A1) with differing quantities of phenolic hydroxyl groups protected with acid-dissociable, dissolution-inhibiting groups (namely, different protection numbers), the alkali solubility of each of these protected forms (A1) will be comparatively uniform. Smaller dispersity values are preferred, and the dispersion degree is even more preferably no more than 1.4, and is most preferably 1.3 or smaller.

Dispersion degrees are usually used for polydisperse compounds such as polymers, but even for monodisperse compounds, the existence of impurities such as production by-products or residual starting materials can result in the appearance of an apparent molecular weight distribution when analysis is conducted using gel permeation chromatography (GPC) or the like. In other words, in the case of a monodisperse compound, a dispersity of 1 indicates a purity degree of 100%, and increasingly large dispersity values indicate larger quantities of impurities.

In the present invention, the dispersion degree of molecular weight is calculated for compounds that exhibit the above type of apparent molecular weight distribution by measuring the weight average molecular weight (Mw) and the number average molecular weight (Mn) using a typical method used for the measurement of these Mw and Mn values for a polymer, such as a GPC method, and then determining the Mw/Mn ratio.

The dispersion degree can be adjusted either by removing reaction by-products and impurities following synthesis of the polyhydric phenol compound (a) that represents the targeted product, or by using conventional methods such as molecular weight fractionation treatments to remove the unneeded molecular weight fractions.

Furthermore, the polyhydric phenol compound (a) is required to be a material capable of forming an amorphous (non-crystalline) film using a spin coating method or the like. In this description, an amorphous film refers to an optically transparent film that does not crystallize. Spin coating is one of the most commonly used techniques for forming thin films, and a judgment as to whether or not a polyhydric phenol compound is capable of forming an amorphous film using spin coating is determined on the basis of whether or not a film formed by spin coating onto an 8-inch silicon wafer is transparent across the entire film surface. More specifically, judgment can be conducted, for example, in the manner described below. First, the polyhydric phenol material is added to a solvent typically used as a resist solvent, such as a mixed solvent of ethyl lactate and propylene glycol monoethyl ether acetate in a ratio (weight ratio) of 40/60 (hereafter this solvent is abbreviated as EM), in sufficient quantity to generate a solution with a concentration of 14% by weight, dissolution is achieved by ultrasound treatment (dissolution treatment) using an ultrasound cleaning apparatus, and the resulting solution is then spin coated onto a wafer at 1,500 rpm and subjected to optional drying and baking (PAB: Post Applied Bake) at 110° C. for 90 seconds, and a visual assessment as to whether the formed film is transparent is then used to confirm whether or not an amorphous film has been formed. A non-transparent, cloudy film is not an amorphous film.

In the present invention, the polyhydric phenol compound (a) preferably exhibits favorable stability for the amorphous film formed in the manner described above. For example, compounds for which the amorphous state of the film is retained even after standing for 2 weeks at room temperature following the above PAB treatment are particularly desirable.

The protected from (A1) is a compound in which either a portion of, or all of, the phenolic hydroxyl groups of the aforementioned polyhydric phenol compound (a) have been protected by substitution with acid-dissociable, dissolution-inhibiting groups.

There are no particular restrictions on the acid-dissociable, dissolution-inhibiting groups, and any group can be selected from amongst the various acid-dissociable, dissolution-inhibiting groups proposed for use within the hydroxystyrenebased resins and acrylate and/or methacrylate-based resins and the like used within conventional KrF and ArF chemically amplified resist compositions.

Specific examples of suitable groups include chain-like alkoxyalkyl groups, tertiary alkyloxycarbonyl groups, tertiary alkyl groups, tertiary alkoxycarbonylalkyl groups, and cyclic ether groups.

Examples of suitable chain-like alkoxyalkyl groups include a 1-ethoxyethyl group, 1-ethoxymethyl group, 1-methoxymethylethyl group, 1-methoxymethyl group, 1-isopropoxyethyl group, 1-methoxypropyl group, 1-ethoxypropyl group, and 1-n-butoxyethyl group.

Examples of suitable tertiary alkyloxycarbonyl groups include a tert-butyloxycarbonyl group and tert-amyloxycarbonyl group.

Examples of suitable tertiary alkyl groups include chain-like tertiary alkyl groups such as a tert-butyl group and tert-amyl group, and tertiary alkyl groups that include an aliphatic polycyclic group such as a 2-methyladamantyl group and 2-ethyladamantyl group.

Examples of suitable tertiary alkoxycarbonylalkyl groups include a tert-butyloxycarbonylmethyl group and tert-amyloxycarbonylmethyl group.

Examples of suitable cyclic ether groups include a tetrahydropyranyl group and tetrahydrofuranyl group.

Of these groups, in terms of providing excellent dissociability, enhancing the uniformity of the protected form (A1), and improving the level of LER, a chain-like alkoxyalkyl group is preferred, and a 1-ethoxyethyl group or 1-ethoxymethyl group is particularly desirable.

Furthermore, in those cases where the protected form (A1) includes a plurality of polyhydric phenol compounds (hereafter also referred to as isomers) with different numbers of phenolic hydroxyl groups protected with acid-dissociable, dissolution-inhibiting groups (that is, different protection numbers), compounds in which the protection numbers for the various isomers are close in value produce superior effects for the present invention, and are consequently preferred.

The proportions of each of the isomers within the protected form (A1) can be measured using a technique such as reverse-phase chromatography.

The proportion of the protected form (A1) within the component (A) is preferably greater than 40% by mass, even more preferably greater than 50% by mass, even more preferably greater than 80% by mass, and is most preferably 100% by mass.

The proportion of the protected form (A1) within the component (A) can be measured using a technique such as reverse-phase chromatography.

The protected form (A1) can be produced, for example, by a method in which either all of, or a portion of, the phenolic hydroxyl groups of either one, or two or more polyhydric phenol compounds (a) are protected with acid-dissociable, dissolution-inhibiting groups using known techniques.

Furthermore, in the protected form (A1), the protection number of each of the isomers can be adjusted by altering the conditions used during the method of protecting the hydroxyl groups with the acid-dissociable, dissolution-inhibiting groups.

The component (A) may also include an unprotected form (A2) of the aforementioned polyhydric phenol compound (a), in which none of the phenolic hydroxyl groups are protected with acid-dissociable, dissolution-inhibiting groups.

The unprotected form (A2) is a compound in which absolutely none of the phenolic hydroxyl groups within the polyhydric phenol compound (a) are protected with acid-dissociable, dissolution-inhibiting groups, in other words, the polyhydric phenol compound (a) itself In the component (A), the proportion of this unprotected form (A2) is preferably kept as low as possible, and is preferably no higher than 60% by mass, even more preferably no higher than 50% by mass, even more preferably 10% by mass or less, and is most preferably 0% by mass. Provided the quantity of the unprotected form (A2) is no higher than 60% by mass, the level of roughness upon pattern formation can be reduced. Moreover, the resolution is also superior.

The proportion of the unprotected form (A2) within the component (A) can be adjusted, for example, by using gel permeation chromatography (GPC) to remove the unprotected form (A2).

The proportion of the unprotected form (A2) within the component (A) can be measured using a technique such as reverse-phase chromatography.

Furthermore, from the viewpoints of resolution and the roughness reduction effect, the phenolic hydroxyl group protection ratio within the component (A), that is, the proportion of phenolic hydroxyl groups that have been protected with acid-dissociable, dissolution-inhibiting groups relative to the combined total of phenolic hydroxyl groups that have been protected with acid-dissociable, dissolution-inhibiting groups and unprotected phenolic hydroxyl groups, is preferably within a range from 5 to 50 mol %, and even more preferably from 7 to 30 mol %.

In the present invention, the component (A) may also include any of the conventional resin components that have been proposed as base material components for chemically amplified resist layers (hereafter referred to as the component (A3)), provided the inclusion of these components does not impair the effects of the present invention.

Examples of this component (A3) include any of the resins proposed as base resins for conventional chemically amplified positive resist compositions for use with a KrF excimer laser or positive resist compositions for use with an ArF excimer laser, and these can be selected in accordance with the nature of the exposure light source used during resist pattern formation.

The quantity of the component (A) within a resist composition of the present invention may be adjusted in accordance with the film thickness of the resist to be formed.

(Component (B))

The component (B) can use any of the known acid generators used in conventional chemically amplified resist compositions without any particular restrictions. Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzyl sulfonate-based acid generators, iminosulfonate-based acid generators, and disulfone-based acid generators.

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl) diphenylsulfonium trifluoromethanesulfonate, heptafluoropropanesulfonate or nonafluorobutanesulfonate, and tri(4-tert-butyl)phenylsulfonium trifluoromethanesulfonate, heptafluoropropanesulfonate or nonafluorobutanesulfonate.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)-benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile. Of these, α-(methylsulfonyloxyimino)-p-methoxyphenyl acetonitrile is preferred.

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (compound A, decomposition point 135° C.), 1,4-bis(phenylsulfonyldiazomethylsulfonyl)butane (compound B, decomposition point 147° C.), 1,6-bis(phenylsulfonyldiazomethylsulfonyl)hexane (compound C, melting point 132° C., decomposition point 145° C.), 1,10-bis(phenylsulfonyldiazomethylsulfonyl)decane (compound D, decomposition point 147° C.), 1,2-bis(cyclohexylsulfonyldiazomethylsulfonyl)ethane (compound E, decomposition point 149° C.), 1,3-bis(cyclohexylsulfonyldiazomethylsulfonyl)propane (compound F, decomposition point 153° C.), 1,6-bis(cyclohexylsulfonyldiazomethylsulfonyl)hexane (compound G, melting point 109° C., decomposition point 122° C.), and 1,10-bis(cyclohexylsulfonyldiazomethylsulfonyl)decane (compound H, decomposition point 116° C.).

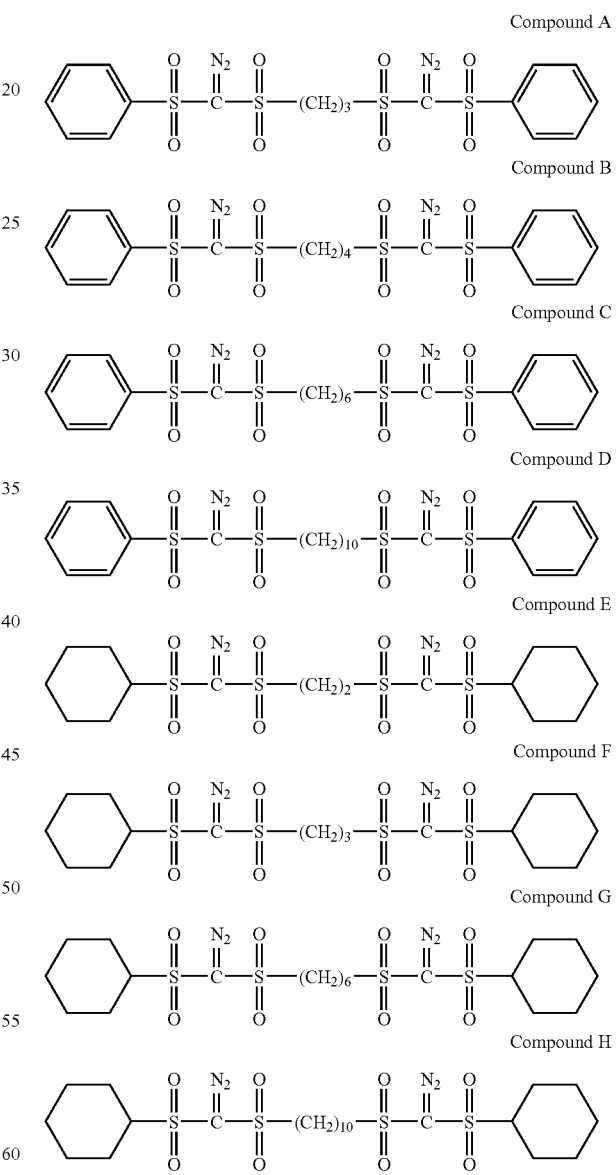

In the present invention, a component (B) that includes an onium salt represented by a general formula (b1) shown below (hereafter referred to as the onium salt (B1)) yields excellent effects for the present invention, and is consequently preferred.

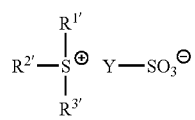

(b1)

(wherein, $R^{1'}$ to $R^{3'}$ each represent, independently, an aryl group or alkyl group, and Y represents a straight-chain, branched, or cyclic alkyl group in which at least one hydrogen atom may be substituted with a fluorine atom.)

In the formula (b1), $R^{1'}$ to $R^{3'}$ each represent, independently, an aryl group or an alkyl group, although of $R^{1'}$ to $R^{3'}$, at least one group preferably represents an aryl group, salts in which two or more groups represent aryl groups are even more preferred, and salts in which $R^{1'}$ to $R^{3'}$ all represent aryl groups are the most desirable.

There are no particular restrictions on the aryl groups of $R^{1'}$ to $R^{3'}$, and suitable examples include aryl groups of 6 to 20 carbon atoms. Examples thereof include phenyl groups and naphthyl groups which may, or may not, be substituted with an alkyl group, halogen atom or the like. From the viewpoint of enabling low-cost synthesis, aryl groups of 6 to 10 carbon atoms are preferred.

There are no particular restrictions on the alkyl groups of $R^{1'}$ to $R^{3'}$, and suitable examples include straight-chain, branched, and cyclic alkyl groups of 1 to 10 carbon atoms. Because they offer superior resolution, alkyl groups of 1 to 5 carbon atoms are preferred. Specific examples of suitable groups include a methyl group, ethyl group, n-propyl group, isopropyl group, n-butyl group, isobutyl group, n-pentyl group, cyclopentyl group, hexyl group, cyclohexyl group, nonyl group, and decanyl group. In terms of achieving superior resolution and enabling low-cost synthesis, a methyl group is preferred.

Of the above possibilities, salts in which $R^{1'}$ to $R^{3'}$ all represent phenyl groups are the most desirable.

A straight-chain or branched alkyl group represented by Y preferably contains from 1 to 10 carbon atoms, even more preferably from 1 to 8 carbon atoms, and most preferably from 3 to 8 carbon atoms.

A cyclic alkyl group represented by Y preferably contains from 3 to 10 carbon atoms, even more preferably from 3 to 8 carbon atoms, and most preferably from 4 to 6 carbon atoms.

Straight-chain alkyl groups are particularly preferred as the group Y.

Hydrogen atoms of the alkyl group represented by Y may be substituted with fluorine atoms. However, in terms of achieving superior effects for the present invention, the fluorine substitution ratio is preferably low, and groups with no fluorine atom substitution are the most desirable.

In those cases where an onium salt (B1) in which the Y group has not been substituted with fluorine atoms is used as the component (B), further improvements in the sensitivity of the resist composition can be expected. In other words, generally, the blend quantity of the component (B) within a resist composition is restricted to less than approximately 10 parts by mass per 100 parts by mass of the component (A), as a result of due consideration of the effects on the resolution and the pattern shape. However, if an onium salt (B1) in which the Y group has not been substituted with fluorine atoms is used, then there are almost no adverse effects on the resolution or pattern shape even if the component (B) is included at much higher concentrations, and high concentration levels such as those exceeding 20 parts by mass become possible, meaning improvements in the sensitivity can be expected by increasing the blend quantity of the component (B).

As the onium salt (B1), onium salts represented by a general formula (b1-1) shown below yield particularly superior effects for the present invention, and are consequently preferred.

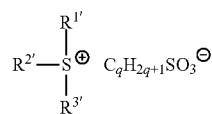

(b1-1)

In the formula (b1-1), $R^{1'}$ to $R^{3'}$ are as defined above. Furthermore, at least one hydrogen atom within the anion portion may be substituted with a fluorine atom.

q is an integer from 1 to 10, preferably an integer from 1 to 8, even more preferably an integer from 4 to 8, and is most preferably either 4 or 8 in terms of the ease of industrial synthesis.

Furthermore, the alkyl group represented by $C_qH_{2q+1}$ may be either a straight-chain or branched group, although a straight-chain alkyl group is preferred, and suitable examples include a methyl group, ethyl group, n-propyl group, n-butyl group, n-pentyl group, n-hexyl group, n-heptyl group, n-octyl group, n-nonyl group, and n-decyl group.

The component (B) may be used as either a single acid generator described above, or a combination of two or more different acid generators.

The quantity used of the component (B) is typically within a range from 0.1 to 60 parts by mass, preferably from 10 to 40 parts by mass, even more preferably from 5 to 30 parts by mass, and most preferably from 5 to 20 parts by mass, per 100 parts by mass of the component (A). Ensuring this quantity is at least as large as the lower limit of the above range enables the effects of the present invention to manifest satisfactorily. If the quantity exceeds the above range, then obtaining a uniform solution becomes problematic, which can cause a deterioration in the level of defects or the storage stability.

(Component (C))

A resist composition of the present invention can be produced by dissolving the aforementioned component (A) and component (B), and any of the optional materials described below, in a component (C).

In the present invention, the component (C) must include an alcohol. In the present invention, the term "alcohol" refers to a compound that contains one or more alcoholic hydroxyl groups within the molecule, and is a liquid at normal temperature and normal pressure (25° C., 760 mmHg). Here, the term "alcoholic hydroxyl group" describes a hydroxyl group bonded to a carbon atom of an aliphatic hydrocarbon. The term "aliphatic" is a relative concept used in relation to the term "aromatic", and defines a group or compound that contains no aromaticity. Moreover, the term "aliphatic" is not restricted to hydrocarbons.

The "aliphatic hydrocarbon" may be either a chain-like (straight-chain or branched-chain) hydrocarbon, or a cyclic hydrocarbon having an aliphatic cyclic group (which may be monocyclic or polycyclic). Furthermore, the "aliphatic hydrocarbon" may be either saturated or unsaturated, but is preferably saturated.

Alcohols in which the carbon atom to which the alcoholic hydroxyl group is bonded is a primary carbon atom are termed primary alcohols, alcohols in which the carbon atom to which the alcoholic hydroxyl group is bonded is a secondary carbon atom are termed secondary alcohols, and alcohols in which the carbon atom to which the alcoholic hydroxyl group is bonded is a tertiary carbon atom are termed tertiary alcohols, and any of these alcohols may be used in the present invention. In the present invention, primary alcohols and secondary alcohols are preferred in terms of the effects achieved for the present invention.

In the present invention, the alcohol may be either a monohydric alcohol that contains a single alcoholic hydroxyl group, or a polyhydric alcohol that contains two or more alcoholic hydroxyl groups, although in terms of the effects achieved for the present invention, monohydric alcohols are preferred.

More specific examples of the alcohol include aliphatic alcohols and aromatic alcohols.

Aliphatic alcohols are alcohols with no aromaticity. For example, examples of monohydric aliphatic alcohols include aliphatic saturated alcohols such as alkyl alcohols in which a single alcoholic hydroxyl group is bonded to a straight-chain, branched, or cyclic aliphatic saturated hydrocarbon, and alkoxyalkyl alcohols in which a hydrogen atom within such an alkyl alcohol is substituted with an alkoxy group; and aliphatic unsaturated alcohols such as alkenyl alcohols and alkynyl alcohols in which a single alcoholic hydroxyl group is bonded to an aliphatic unsaturated hydrocarbon containing a double bond or triple bond.

As a straight-chain alkyl alcohol, alcohols of 1 to 10 carbon atoms are preferred, and alcohols of 3 to 6 carbon atoms are even more desirable. Specific examples include 1-propanol, n-butanol, 2-butanol, 1-pentanol, 2-pentanol, and 3-pentanol.

As a branched alkyl alcohol, alcohols of 3 to 10 carbon atoms are preferred, and alcohols of 4 to 6 carbon atoms are even more desirable. Specific examples include 2-methyl-1-propanol, neopentyl alcohol, tert-amyl alcohol, isoamyl alcohol, 3-methyl-2-butanol, 2-methyl-1-butanol, 2-ethyl-1-butanol, 2-methyl-1-pentanol, and 4-methyl-2-pentanol.

As a cyclic alkyl alcohol, alcohols of 3 to 8 carbon atoms are preferred, and alcohols of 3 to 6 carbon atoms are even more desirable. Specific examples include cyclopropanol, cyclobutanol, cyclopentanol, and cyclohexanol.

As an alkoxyalkyl alcohol, the number of carbon atoms of the alkoxy group is preferably within a range from 1 to 4, and even more preferably from 1 to 3. Furthermore, the number of alkoxy groups is preferably within a range from 1 to 3, and is most preferably 1. Specific examples of alkoxyalkyl alcohols include 2-methoxyethanol, 2-ethoxyethanol, 1-ethoxy-2-propanol, and 1-methoxy-2-propanol. The number of carbon atoms of the alkyl group within the alkoxyalkyl alcohol is preferably within a range from 2 to 6, and even more preferably from 2 to 4.

As an aliphatic unsaturated alcohol, alcohols of 2 to 8 carbon atoms are preferred, and alcohols of 2 to 6 carbon atoms are even more desirable. Specific examples include propargyl alcohol, 3-methyl-1-butyn-3-ol, and 3-methyl-1-pentyn-3-ol.

Furthermore, examples of suitable polyhydric aliphatic alcohols include ethylene glycol, diethylene glycol, propylene glycol, and dipropylene glycol.

Examples of suitable aromatic alcohols include alcohols in which an aromatic hydrocarbon group is bonded, as a side chain, to one of the above aliphatic alcohols, and specific examples include benzyl alcohol and 2-phenylethyl alcohol.

Of these, in terms of the effects achieved for the present invention, the alcohol is preferably an aliphatic alcohol.

Furthermore, alcohols with a boiling point that falls within a range from at least 95° C. to less than 150° C. yield superior effects for the present invention, and are consequently preferred. The boiling point of the alcohol is even more preferably within a range from 100 to 140° C., and is most preferably from 105 to 135° C.

The alcohol is preferably at least one alcohol selected from the group consisting of 1-propanol (boiling point: 97.2° C.), n-butanol (boiling point: 117.7° C.), 2-butanol (boiling point: 99.5° C.), 1-pentanol (boiling point: 138.0° C.), 2-pentanol (boiling point: 119.3° C.), 3-pentanol (boiling point: 115.6° C.), 2-methyl-1-propanol (boiling point: 107.9° C.), neopentyl alcohol (boiling point: 114° C.), tert-amyl alcohol (boiling point: 101.8° C.), isoamyl alcohol (boiling point: 130.8° C.), 3-methyl-2-butanol (boiling point: 112.0° C.), 2-methyl-1-butanol (boiling point: 128.0° C.), 2-ethyl-1-butanol (boiling point: 147.0° C.), 2-methyl-1-pentanol (boiling point: 148.0° C.), 4-methyl-2-pentanol (boiling point: 131.8° C.), 2-methoxyethanol (boiling point: 124.6° C.), 2-ethoxyethanol (boiling point: 135.6° C.), 1-ethoxy-2-propanol (boiling point: 132.8° C.), 1-methoxy-2-propanol (boiling point: 121° C.), propargyl alcohol (boiling point: 115.0° C.), 3-methyl-1-butyn-3-ol (boiling point: 104° C.), and 3-methyl-1-pentyn-3-ol (boiling point: 121° C.).

Of these, at least one alcohol selected from the group consisting of 4-methyl-2-pentanol (boiling point: 131.8° C.), 2-methyl-1-propanol (boiling point: 107.9° C.), and 2-methoxyethanol (boiling point: 124.6° C.) yields superior effects for the present invention and is consequently preferred.

The proportion of the alcohol within the component (C) is preferably at least 50% by mass, even more preferably 70% by mass or greater, even more preferably 90% by mass or greater, and is most preferably 100% by mass.

The component (C) may also include, besides the alcohol described above, either one, or two or more solvents selected from known organic solvents (other than alcohols) used as the solvents for conventional chemically amplified resists. Examples of these organic solvents include lactones such as γ-butyrolactone; ketones such as acetone, methyl ethyl ketone, cyclohexanone, methyl isoamyl ketone and 2-heptanone; chain-like ethers in which all of the alcoholic hydroxyl groups within a polyhydric alcohol or derivative thereof, such as ethylene glycol, ethylene glycol monoacetate, diethylene glycol, diethylene glycol monoacetate, propylene glycol, propylene glycol monoacetate, dipropylene glycol or dipropylene glycol monoacetate, have been substituted with alkoxy groups (such as a methoxy group, ethoxy group, propoxy group or butoxy group); cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate.

These organic solvents may be used either alone, or as a mixed solvent of two or more different solvents.

There are no particular restrictions on the blend quantity of the component (C) within the resist composition, which is set in accordance with the coating film thickness so as to produce a concentration that enables favorable application to a substrate or the like, The quantity of the component (C) is typically sufficient to produce a solid content concentration within the resist composition of 2 to 20% by mass, and preferably from 5 to 15% by mass.

(Component (D))

In a resist composition of the present invention, in order to improve the resist pattern shape and the post exposure stability of the latent image formed by the pattern-wise exposure of the resist layer, a nitrogen-containing organic compound (D) (hereafter referred to as the component (D)) can be added as an optional component.

A multitude of these organic compounds have already been proposed, and any of these known compounds can be used as the component (D). Examples thereof include monoalkylamines such as n-hexylamine, n-heptyl amine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Of these, secondary aliphatic amines and tertiary aliphatic amines are preferred, trialkylamines of 5 to 10 carbon atoms are even more preferred, and tri-n-octylamine is the most preferred.

These compounds can be used either alone, or in combinations of two or more different compounds.

The component (D) is typically used in a quantity within a range from 0.01 to 5.0 parts by mass per 100 parts by mass of the component (A).

(Component (E)) Furthermore, in a positive resist composition of the present invention, in order to prevent any deterioration in sensitivity caused by the addition of the above component (D), and improve the resist pattern shape and the post exposure stability of the latent image formed by the patternwise exposure of the resist layer and the like, an organic carboxylic acid, or a phosphorus oxo acid or derivative thereof (E) (hereafter they are referred to as the component (E)) can also be added as another optional component. The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by mass per 100 parts by mass of the component (A). (Other Optional Components) Other miscible additives can also be added to a positive resist composition of the present invention according to need, and examples include additive resins for improving the performance of the resist film, surfactants for improving the ease of application, dissolution inhibitors, plasticizers, stabilizers, colorants, halation prevention agents, and dyes and the like.

(Process for Forming Resist Pattern)

A process for forming a resist pattern according to the present invention includes the steps of forming a resist film on a substrate using an aforementioned resist composition according to the present invention, exposing the resist film, and developing the resist film to form a resist pattern. More specifically, a resist pattern can be formed using, for example, the type of resist pattern formation process described below. Namely, a resist composition described above is first applied to the surface of a substrate such as a silicon wafer using a spinner or the like, and an optional prebake (PAB) is then conducted, thereby forming a resist film. The thus formed resist film is then subjected to selective exposure using an exposure apparatus such as an electron beam lithography apparatus or an EUV exposure apparatus, either by conducting exposure through a mask pattern, or by patterning of the resist film by direct irradiation with an electron beam without using a mask pattern, and PEB (post exposure baking) is then conducted. Subsequently, a developing treatment is conducted using an alkali developing solution, a rinse treatment is performed to wash the developing solution and the resist composition dissolved by the developing solution off the substrate surface, and the substrate is then dried, yielding a resist pattern.

These steps can be conducted using conventional techniques. The conducting conditions and the like are preferably set in accordance with factors such as the components and properties of the positive resist composition that is used.

There are no particular restrictions on the exposure light source, and an ArF excimer laser, KrF excimer laser, $F_2$ excimer laser, or other radiation such as EUV (extreme ultraviolet), VUV (vacuum ultraviolet), electron beam, X-ray or soft X-ray radiation can be used. A positive resist composition according to the present invention is particularly effective for irradiation using an electron beam or EUW, and especially for an electron beam.

In some cases, a post bake step may be included following the above alkali developing treatment, and an organic or inorganic anti-reflective film may also be provided between the substrate and the resist film.

As described above, a resist composition and a process for forming a resist pattern according to the present invention enable the formation of a resist pattern with a favorable level of LER. It is thought that the reason for this observation is that because the protected form (A1) and the alcohol exhibit a high degree of compatibility, the properties (such as the hydrophilicity, hydrophobicity, and crystallinity) of a resist film formed using a resist composition containing these components are very uniform throughout the film. In other words, conventionally, during the spin coating process used for forming the resist film, those molecules with a higher level of hydrophilicity and those molecules with a higher level of hydrophobicity have tended to accumulate individually in a partially localized manner, meaning fluctuations tended to develop in the distribution of the component (B) and the like. It is thought that, as a result, LER has tended to increase as a result of factors such as a lack of uniformity in the rate at which the acid-dissociable, dissolution-inhibiting groups undergo dissociation (the deprotection reaction) under the action of the generated acid at the interface between the exposed portions and the unexposed portions, and fluctuations in the alkali solubility of molecules of the various base material component following the deprotection reaction, which causes variations in the solubility rate of the resist film. In contrast, in the present invention, it is thought that because a uniform film can be formed, the level of LER can be reduced.

In particular, if the boiling point of the alcohol is within a range from at least 95° C. to less than 150° C., then the effects of the present invention are particularly pronounced. It is surmised that the reason for this preference is that alcohols with a boiling point less than 150° C. exhibit a more rapid evaporation rate during resist film formation, meaning the time from application of the composition until the film is formed is short, thereby preventing the base material components from migrating in accordance with their hydrophilicity or hydrophobicity to form a non-uniform film, and provided the boiling point of the alcohol is at least 95° C., a certain residual quantity of the solvent is retained within the film following baking, thereby preventing the crystallinity of the film from increasing.

Furthermore, by using an onium salt in which the anion is an alkylsulfonate ion in which the hydrogen atoms have not been substituted with fluorine atoms, the level of LER can be further reduced. It is thought that this is because the high degree of compatibility between the onium salt and the alcohol enables the formation of a more uniform resist film, in a similar manner to that described above.

EXAMPLES

As follows is a description of examples of the present invention, although the scope of the present invention is in no way limited by these examples.

Production Example 1

10 g of the polyhydric phenol compound represented by the above formula (I-1) (molecular weight: 981, hereafter abbreviated as MBSA) was dissolved in 33 g of tetrahydrofuran, 1.8 g of ethyl vinyl ether was added, and the resulting mixture was reacted for 12 hours at room temperature under constant stirring. Following completion of the reaction, the product was extracted and purified using a water/ethyl acetate system. This yielded 10.1 g of a MBSA protected form (a1).

Using a 400 MHz proton NMR apparatus manufactured by JEOL Ltd., the number of phenolic hydroxyl groups within the thus obtained MBSA protected form (a1), and the number of phenolic hydroxyl groups protected with 1-ethoxyethyl groups were measured, and determination of the protection ratio (mol %) revealed a value of 19.9 mol %. The protection ratio was determined using the formula: {number of phenolic hydroxyl groups protected with 1-ethoxyethyl groups/(number of phenolic hydroxyl groups +number of phenolic hydroxyl groups protected with 1-ethoxyethyl groups)}×100.

Example 1

100 parts by mass of the MBSA protected form (a1) obtained in the production example 1, 10 parts by mass of triphenylsulfonium nonafluoro-n-butanesulfonate (TPS-PFBS), and 1 part by mass of tri-n-octylamine were dissolved in 2-methoxyethanol, yielding a positive resist composition solution with a solid content concentration of 6% by mass.

Subsequently, the thus obtained positive resist composition solution was applied uniformly, using a spinner, to the surface of an 8-inch silicon substrate that had been treated with hexamethyldisilazane, and was then subjected to a bake treatment (PAB) at 110° C. for 90 seconds, thus forming a resist film (film thickness: 150 nm).

This resist film was then subjected to direct patterning (exposure) with an electron beam lithography apparatus (LBX-5FE, manufactured by JEOL Ltd., accelerating voltage: 50 kV), and was then subjected to a bake treatment (PEB) at 100° C. for 90 seconds. The resist film was then developed for 60 seconds in a 2.38% by mass aqueous solution (at 23° C.) of tetramethylammonium hydroxide (TMAH), and was subsequently rinsed in pure water for 30 seconds, thus forming a line and space (L/S) pattern. The thus obtained resist pattern was subjected to the evaluations described below. The results of the evaluations are shown in Table 1.

(Sensitivity)

The sensitivity (EOP) was evaluated by measuring the exposure time which is required to form a 100 nm L/S pattern in a 1:1 ratio. Unit of the sensitivity is $\mu C/cm^2$ (the quantity of energy).

(Resolution)

L/S patterns were formed at the above EOP value, and the critical resolution (nm) was determined using a scanning electron microscope manufactured by Hitachi, Ltd. (length measuring SEM, S-4700).

(LER)

The LER was evaluated by inspection of a 100 nm L/S pattern formed at the above EOP value, using a scanning electron microscope manufactured by Hitachi, Ltd. (length measuring SEM, S-4700).

A: the resist pattern was favorable, with no irregularities within the line side walls.

B: some slight irregularities were visible within the line side walls of the resist pattern, but at a level unlikely to cause any practical problems.

C: the resist pattern exhibited severe irregularities within the line side walls.

Example 2

With the exception of replacing the TPS-PFBS (10 parts by mass) used in the example 1 with triphenylsulfonium n-octanesulfonate (TPS-nOS) (8 parts by mass), a positive resist composition solution was obtained in the same manner as the Example 1.

The 10 parts by mass of TPS-PFBS and the 8 parts by mass of TPS-nOS represent substantially the same number of mols.

Subsequently, the thus obtained positive resist composition solution was subjected to the same evaluations as those described in the Example 1.

The results are shown in Table 1.

Example 3

With the exception of replacing the 2-methoxyethanol used in the Example 1 with 2-methyl-1-propanol, a positive resist composition solution was obtained in the same manner as the Example 1.

Subsequently, the thus obtained positive resist composition solution was subjected to the same evaluations as those described in the Example 1.

The results are shown in Table 1.

Example 4

With the exception of replacing the 2-methoxyethanol used in the Example 1 with 4-methyl-2-propanol, a positive resist composition solution was obtained in the same manner as the Example 1.

Subsequently, the thus obtained positive resist composition solution was subjected to the same evaluations as those described in the Example 1.

The results are shown in Table 1.

Comparative Example 1

With the exception of replacing the 2-methoxyethanol used in the Example 1 with propylene glycol monomethyl ether acetate (PGMEA), a positive resist composition solution was obtained in the same manner as the Example 1.

Subsequently, the thus obtained positive resist composition solution was subjected to the same evaluations as those described in the example 1.

During these evaluations, the PAB conditions were altered to 120° C. for 90 seconds. The results are shown in Table 1.

TABLE 1

| | Example 1 | Example 2 | Example 3 | Example 4 | Comparative Example 1 |
|---|---|---|---|---|---|
| Sensitivity ($\mu C/cm^2$) | 15.6 | 12.9 | 17.9 | 14.9 | 10.4 |
| Resolution (nm) | 55 | 55 | 55 | 55 | 60 |
| LER | B | A | B | B | C |

As is evident from the above results, the positive resist compositions of the examples 1 through 4 exhibited high resolution and favorable LER levels. Furthermore, the sensitivity was also excellent.

Of these, the example 2 that used TPS-nOS as the component (B) exhibited a particularly superior LER result. It is thought that the reason for this observation is that because the anion portion of the TPS-nOS is an alkylsulfonate ion with no fluorine atom substitution, it exhibits a particularly high degree of solubility within the alcohol, meaning the resulting resist is formed with a higher level of uniformity.

In contrast, although the comparative example 1 that used PGMEA as the component (C) exhibited a high level of sensitivity, the resolution was poor, and the level of LER was significantly greater than in the examples.

INDUSTRIAL APPLICABILITY

The present invention provides a resist composition and a process for forming a resist pattern that enable the formation of a high resolution pattern with a reduced Level of LER.

The invention claimed is:

1. A positive resist composition, comprising a base material component (A), an acid generator component (B) that generates acid on exposure, and an organic solvent (C), in which the components (A) and (B) are dissolved in the organic solvent (C), wherein:

the base material component (A) comprises a protected form (A1) of a polyhydric phenol compound (a) having two or more phenolic hydroxyl groups and a molecular weight within a range from 300 to 2,500, in which either a portion of, or all of, the phenolic hydroxyl groups are protected with acid-dissociable, dissolution-inhibiting groups, an unprotected form (A2), which is the unprotected form of the polyhydric phenol compound (a) in which none of the phenolic hydroxyl groups are protected with acid-dissociable, dissolution-inhibiting groups, and (A3), which is any other base resin component of the positive resist composition;

the organic solvent (C) comprises an alcohol; and the proportion of the protected form (A1) within the component (A) is within a range from greater than 80% to 100% by mass, wherein the polyhydric phenol compound (a) comprises at least one compound selected from the group consisting of compounds represented by general formulas (I), (II) and (III) shown below:

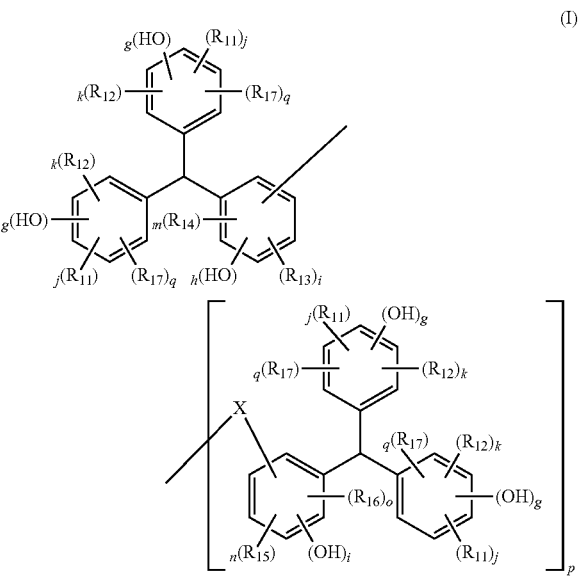

[where in the formula (1), $R_{11}$ through $R_{17}$ each represent, independently, an alkyl group of 1 to 10 carbon atoms or aromatic hydrocarbon group, which may comprise a hetero atom within a structure thereof; g and j each represent, independently, an integer of 1 or greater, k and q each represent either 0 or an integer of 1 or greater, and g+j+k+q is no greater than 5; h is an integer of 1 or greater, l and m each represent, independently, either 0 or an integer of 1 or greater, and h+l+m greater than 4; i is an integer of 1 and o each represent, independently, either 0 or an integer of 1 or greater, and i+n+o is no greater than 4; p is either 0 or 1; and X is a group represented by a general formula (Ia) or (Ib) shown below:

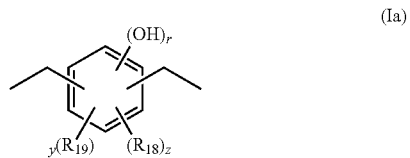

(Ib)

(where in the formula (Ia), $R_{18}$ and $R_{19}$ each represent, independently, an alkyl group of 1 to 10 carbon atoms or aromatic hydrocarbon group, which may include a hetero atom within a structure thereof, r, y, and z each represent, independently, either 0 or an integer of 1 or greater, and r+y+z is no greater than 4)];

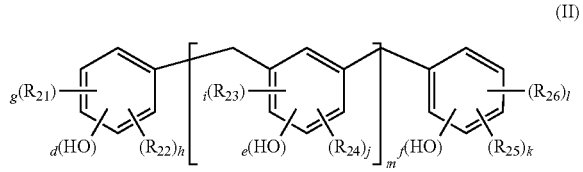
(II)

(wherein the formula (II), $R_{21}$ through $_{26}$ each represent, independently, an alkyl group of 1 to 10 carbon atoms or aromatic hydrocarbon group, which may comprise a hetero atom within a structure thereof; d and g each represent, independently, an integer of 1 or greater, h represents either 0 or an integer of 1 or greater, and d+g+h is no greater than 5; e is an integer of 1 or greater, i and j each represent, independently, either 0 or an integer of 1 or greater, and e+i+j is no greater than 4; f and k each re resent independently, an integer of 1 represents either 0 or an integer of 1 or greater, and f+k+l is no greater than 5; and m is an integer from 1 to 20);

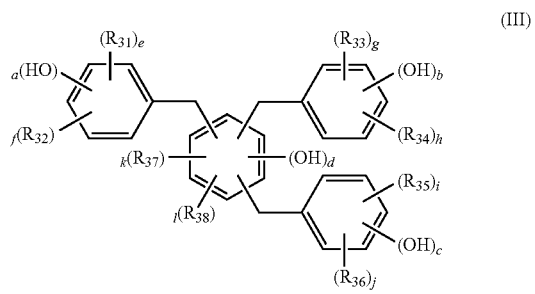
(III)

(wherein the formula (III), $R_{31}$ through $R_{38}$ each represent, independently, an alkyl, group of 1 to 10 carbon atoms or aromatic hydrocarbon group, which may include a hetero atom within a structure thereof; a and e each represent, independently, an integer of 1 or greater, f represents either 0 or an integer of 1 or greater, and a+e+f is no greater than 5; b and h each represent, independently, an integer of l or greater, represents either 0 or an integer of 1 or greater, and b+h+g is no greater than 5; c and i each represent, independently, an integer of 1 or greater, j represnts either 0 or an integer of 1 or greater, and c+i+j is no greater than 5; d is an integer of 1 or greater, k and 1 each represent, independently, either 0 or an integer of 1 or greater, and d+k+l is no greater than 3).

2. The positive resist composition according to claim 1, wherein the alcohol is an aliphatic alcohol.

3. The positive resist composition according to claim 1 or 2, wherein the boiling point of the alcohol is within a range from at least 95° C. to less than 150° C.

4. The positive resist composition according to claim 3, wherein the alcohol is at least one selected from the group consisting of 1-propanol, n-butanol, 2-butanol, 1-pentanol, 2-pentanol, 3-pentanol, 2-methyl- 1 -propanol, neopentyl alcohol, tert-amyl alcohol, isoamyl alcohol, 3-methyl-2-butanol, 2-methyl- 1 -butanol, 2-ethyl- 1 -butanol, 2 -methyl-1-pentanol, 4-methyl-2-pentanol, 2-methoxyethanol, 2-ethoxyethanol, 1-ethoxy-2-propanol, 1-methoxy-2-propanol, propargyl alcohol, 3 -methyl-1-butyn-3 -ol, and 3 -methyl-1 -pentyn-3 -ol.

5. The positive resist composition according to claim 4, wherein the alcohol is at least one selected from the group consisting of 4-methyl-2-pentanol, 2-methyl- 1 -propanol, and 2-methoxyethanol.

6. The positive resist composition according to claim 1, wherein the component (B) comprises an onium salt represented by a general formula (b1) shown below:

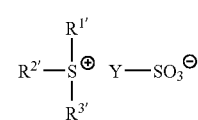
(b1)

(wherein, $R^{1'}$ to $R^{3'}$ each represent, independently, an aryl group or alkyl group, and Y represents a straight-chain, branched, or cyclic alkyl group in which at least one hydrogen atom may be substituted with a fluorine atom).

7. The positive resist composition according to claim 6, wherein the component (B) comprises an onium salt represented by a general formula (b1-1) shown below:

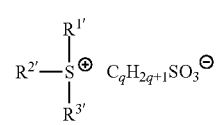
(b1-1)

(wherein, $R^{1'}$ to $R^{3'}$ each represent, independently, an aryl group or alkyl group, q is an integer from 1 to 10, and a hydrogen atom within an anion portion may be substituted with a fluorine atom).

8. The positive resist composition according to claim 1, further comprising a nitrogen-containing organic compound (D).

9. The positive resist composition according to claim 1, wherein an exposure light source used for the exposure is either an electron beam or EUV.

10. A process for forming a resist pattern, comprising forming a resist film on a substrate using a positive resist composition according to any one of claim 1 through claim 5 and claim 6 through claim 9, exposing the resist film, and developing the resist film to form a resist pattern.

11. The positive resist composition according to claim 1, wherein the proportion of the protected form (A1) within the component (A) is 100% by mass.

12. The positive resist composition according to claim 1, wherein the polyhydric phenol compound (a) comprises a compound represented by general formula (I) shown below:

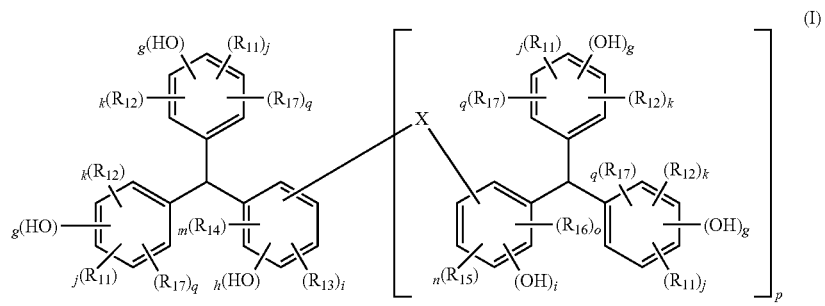

[where in the formula (1), $R_{11}$ through $R_{17}$ each represent, independently, an alkyl group of 1 to 10 carbon atoms or aromatic hydrocarbon group, which may comprise a hetero atom within a structure thereof; g and j each represent, independently, an integer of 1 or greater, k and q each represent either 0 or an integer of 1 or greater, and g+j+k+q is no greater than 5; h is an integer of 1 or greater, l and m each represent, independently, either 0 or an integer of 1 or greater, and h+l+m is no greater than 4; i is an integer of 1 or greater, n and o each represent, independently, either 0 or an integer of 1 or greater, and i+n+o is no greater than 4; p is 1; and X is a group represented by a general formula (Ia) or (Ib) shown below:

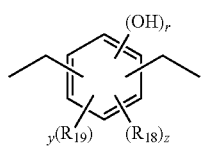

(Ia)

(Ib)

(where in the formula (Ia), $R_{18}$ and $R_{19}$ each represent, independently, an alkyl group of 1 to 10 carbon atoms or aromatic hydrocarbon group, which may include a hetero atom within a structure thereof, r, y, and z each represent, independently, either 0 or an integer of 1 or greater, and r+y+z is no greater than 4)].

13. The positive resist composition according to claim 12, wherein the compound represented by general formula (I) is a compound represented by a formula (I-1) or (I-2) shown below.

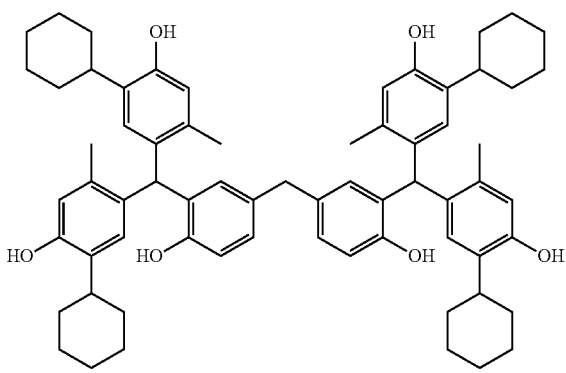

14. The positive resist composition according to claim 1, wherein the phenolic hydroxyl group protection ratio within the component (A), that is, the proportion of phenolic hydroxyl groups that have been protected with acid-dissociable, dissolution-inhibiting groups relative to the combined total of phenolic hydroxyl groups that have been protected with acid-dissociable, dissolution-inhibiting groups and unprotected phenolic hydroxyl groups, is within a range from 5 to 50 mol%.

15. The positive resist composition according to claim 1, wherein the phenolic hydroxyl group protection ratio within the component (A), that is, the proportion of phenolic hydroxyl groups that have been protected with acid-dissociable, dissolution-inhibiting groups relative to the combined total of phenolic hydroxyl groups that have been protected with acid-dissociable, dissolution-inhibiting groups and unprotected phenolic hydroxyl groups, is within a range from 7 to 30 mol%.

* * * * *

UNITED STATES PATENT AND TRADEMARK OFFICE
CERTIFICATE OF CORRECTION

PATENT NO.         : 7,901,865 B2
APPLICATION NO.    : 11/574805
DATED              : March 8, 2011
INVENTOR(S)        : Taku Hirayama et al.

It is certified that error appears in the above-identified patent and that said Letters Patent is hereby corrected as shown below:

Title Page 1, (Item 56) Column 2, Line 29, Under Other Publications, Change "Amorpjous" to --Amorphous--.

At Column 3, Line 4, Change "of;" to --of,--.

At Column 7, Line 15, Change "independent," to --independently,--.

At Column 9, Line 56, Change "(A1) ," to --(A1),--.

At Column 10, Line 2, Change "itself" to --itself.--.

At Column 17, Line 4, Change "n-heptyl amine," to --n-heptylamine,--.

At Column 17, Line 51-60, Change "The Component (E) is typically used in a quantity within a range from 0.01 to 5.0 parts by mass per 100 parts by mass of the component (A). (Other Optional Components) Other miscible additives can also be added to a positive resist composition of the present invention according to need, and examples include additive resins for improving the performance of the resist film, surfactants for improving the ease of application, dissolution inhibitors, plasticizers, stabilizers, colorants, halation prevention agents, and dyes and the like."
To --The component (E) is typically used in a quantity within a range from 0.01 to 5.0 parts by mass per 100 parts by mass of the component (A).
(Other Optional Components)
Other miscible additives can also be added to a positive resist composition of the present invention according to need, and examples include additive resins for improving the performance of the resist film, surfactants for improving the ease of application, dissolution inhibitors, plasticizers, stabilizers, colorants, halation prevention agents, and dyes and the like.--.

At Column 18, Line 16, Change "nnse" to --rinse--.

Signed and Sealed this
Twenty-seventh Day of September, 2011

David J. Kappos
*Director of the United States Patent and Trademark Office*

CERTIFICATE OF CORRECTION (continued)
U.S. Pat. No. 7,901,865 B2

At Column 18, Line 33 (Approx.), Change "EUW," to --EUV,--.

At Column 19, Line 49, Change "(a1) ," to --(a1),--.

At Column 21, Line 59 (Approx.), Change "Level" to --level--.

At Column 22, Line 55, In Claim 1, before "greater" insert --is no--.

At Column 22, Line 55, In Claim 1, change "1and" to --1 or greater n and--.

At Column 23, Line 24 (Approx.), In Claim 1, change "$_{26}$" to --$R_{26}$--.

At Column 23, Line 32, In Claim 1, change "re resent" to --represent,--.

At Column 23, Line 32, In Claim 1, after "1" insert --or greater, 1--.

At Column 23, Line 51, In Claim 1, change "alkyl," to --alkyl--.

At Column 23, Line 58, In Claim 1, change "I" to --1--.

At Column 23, Line 58, In Claim 1, after "greater," insert --g--.

At Column 23, Line 61, In Claim 1, change "represnts" to --represents--.